United States Patent
Liu et al.

(10) Patent No.: US 6,399,483 B1
(45) Date of Patent: Jun. 4, 2002

(54) METHOD FOR IMPROVING FACETING EFFECT IN DUAL DAMASCENE PROCESS

(75) Inventors: Jen-Cheng Liu, Chia-Tih; Ming-Huei Lui, Taipei; Hun-Jan Tao; Chia Shiung Tsai, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/624,523

(22) Filed: Jul. 24, 2000

Related U.S. Application Data

(63) Continuation-in-part of application No. 09/373,245, filed on Aug. 12, 1999, now abandoned.

(51) Int. Cl.[7] .................. H01L 21/4763; H01L 21/302; H01L 21/461
(52) U.S. Cl. ....................................... 438/638; 438/738
(58) Field of Search ............................... 438/636, 638, 438/738, 740

(56) References Cited

U.S. PATENT DOCUMENTS

| | | | |
|---|---|---|---|
| 5,562,801 A | 10/1996 | Nulty | 156/643.1 |
| 5,753,418 A | 5/1998 | Tsai et al. | 430/313 |
| 5,767,017 A | 6/1998 | Armacost et al. | 438/694 |
| 5,811,357 A | 9/1998 | Armacost et al. | 438/723 |
| 2001/0008226 A1 * | 7/2001 | Hung et al. | 216/18 |

* cited by examiner

Primary Examiner—Olik Chaudhuri
Assistant Examiner—Erik Kielin
(74) Attorney, Agent, or Firm—George O. Saile; Stephen B. Ackerman

(57) ABSTRACT

A new method is provided for creating the interconnect pattern for dual damascene structures. The dual damascene structure is created in two overlying levels of dielectric, a first etch stop layer is deposited over the surface of the substrate, a second etch stop layer is deposited between the two layers of dielectric. A first etch penetrates both layers of dielectric, a second etch penetrates the top dielectric layer. Before the second etch is performed, a layer of ARC is deposited. For the second etch a polymer rich etchant is used to protect the sidewalls of the opening. The second etch leaves in place a fence of material (containing C, H, F and oxide compounds) that is formed around the upper perimeter of the opening through the lower layer of dielectric. This fence protects the upper corners of the lower opening of the dual damascene structure and is removed in a two step procedure. At the completion of this two step procedure the upper corners of the lower opening of the dual damascene structure have retained a rectangular profile. A final step removes the photoresist (that has been used to create the interconnect line opening) from the surface of the second layer of dielectric while the remnants of the ARC material are also removed.

8 Claims, 5 Drawing Sheets

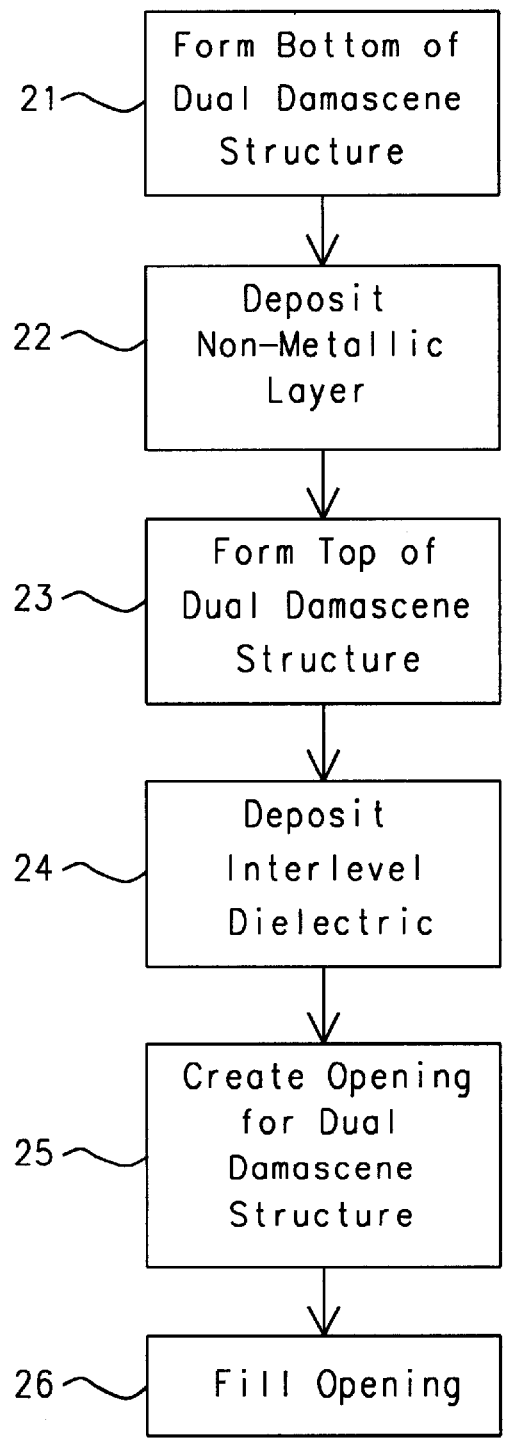
FIG. 1a – Prior Art

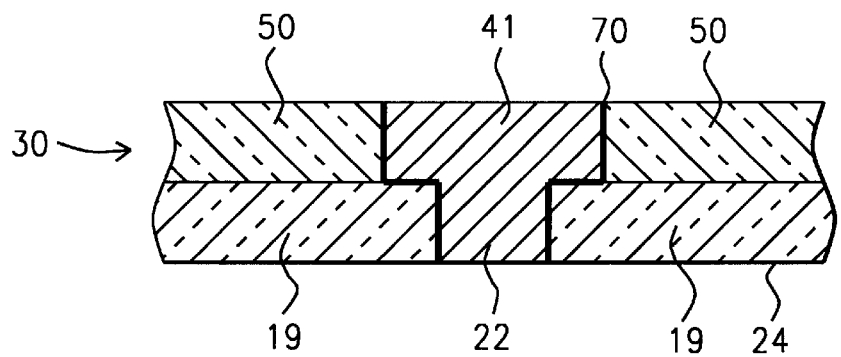
FIG. 1b – Prior Art
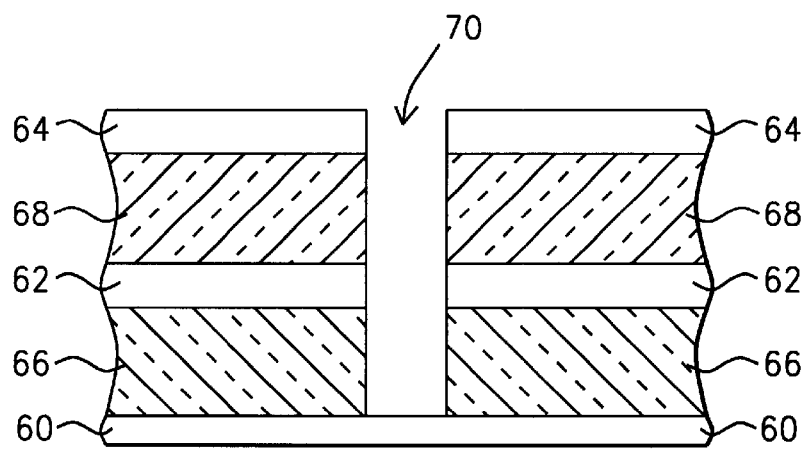
FIG. 2 – Prior Art
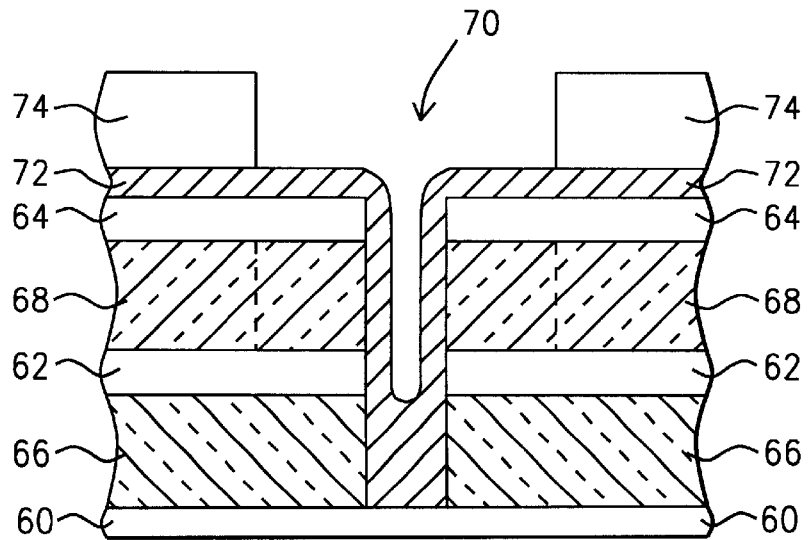
FIG. 3 – Prior Art

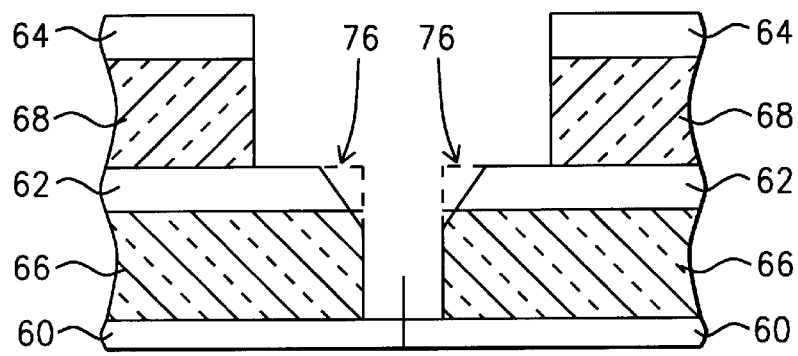
FIG. 4 – Prior Art
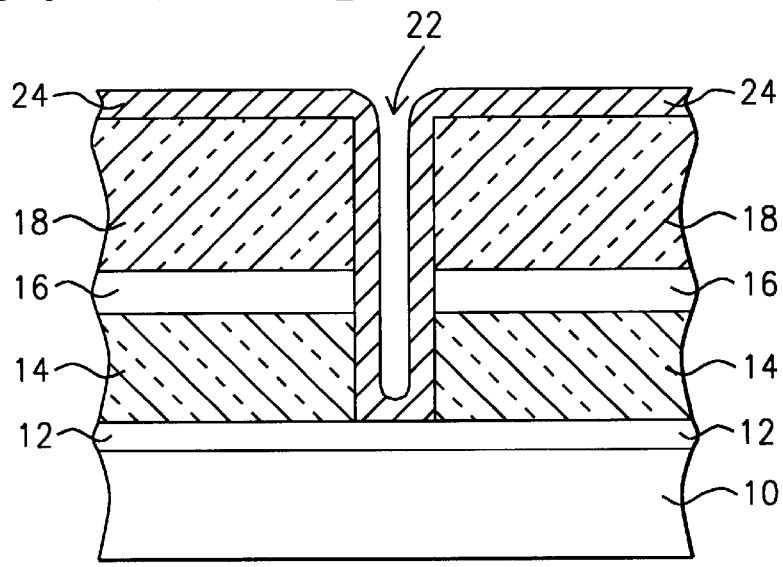
FIG. 5
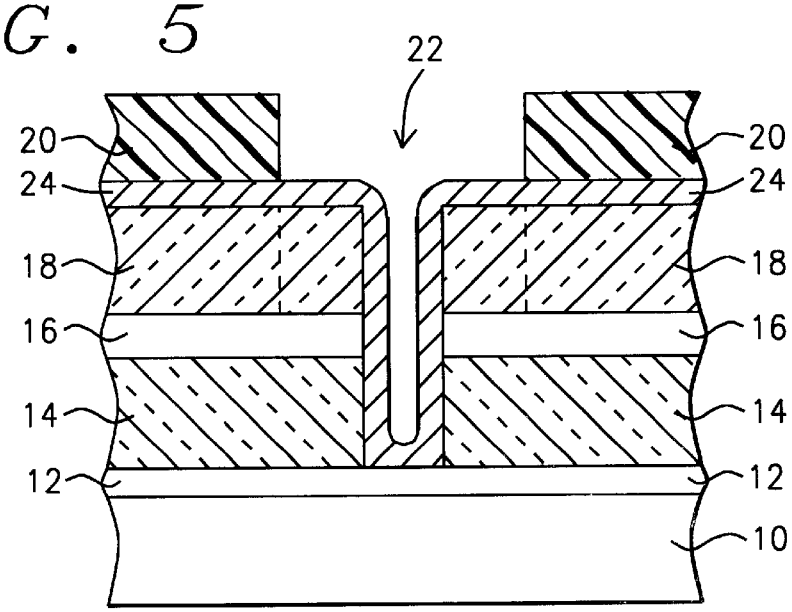
FIG. 6

METHOD FOR IMPROVING FACETING EFFECT IN DUAL DAMASCENE PROCESS

This application is a continuation in part of Ser. No. 09/373,245, filed on Aug. 12, 1999, now abandoned and assigned to a common assignee.

BACKGROUND OF THE INVENTION (1) Field of the Invention

The invention relates to the fabrication of integrated circuit devices, and more particularly, to a method for improving the contour control of openings created for copper dual damascene structures.

(2) Description of the Prior Art

Semiconductor devices are typically fabricated by the creation of a multiplicity of conductive regions on the surface of a semiconductor substrate. These conductive regions are isolated from each other by dielectric layers. Dielectric layers can contain a large number of materials such as silicon dioxide ("oxide") or silicon nitride ("nitride"), tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), tantalum pentoxide ($Ta_2O_5$), plasma enhanced silicon nitride (PSiNx), titanium oxide, oxynitride, a low dielectric constant material, such as hydrogen silsesquioxane, HDP-FSG (high-density-plasma fluorine-doped silicide glass) is a dielectric that has a lower dielectric constant than regular oxide. Some of the dielectrics, such as silicon dioxides can be grown on the surface of the substrate or can be physically deposited by for instance a sputtering process or by other chemical methods of dielectric deposition. The native properties of a dielectric can further be altered by doping the dielectric layer by either n-type dopants such as arsenic and phosphorous or p-type dopants such as indium or boron. The method of forming the dielectric layer and the doping that is applied to this layer is determined by various device and processing considerations.

To interconnect the various layers of interconnecting conducting lines that are created within the structure of a semiconductor device, openings must be created in the dielectric. These openings are filled with a metal that can contain tungsten, titanium nitride, molybdenum, silicide and polysilicon but typically contains tungsten, wolfram or copper. These openings can be further differentiated between contact openings and via openings. A contact opening is generally defined as an opening made through a layer of dielectric whereby the opening exposes a diffusion region or an opening that is made through a dielectric that has been deposited between a layer of polysilicon and a layer of first level metal. Via openings are generally defined as openings that are created through other layers of oxide such as layers of inter-metal dielectric.

The process of creating an opening starts with the deposition of a layer of dielectric (the dielectric into which the openings are to be made) over which a layer of photoresist is deposited. The layer of photoresist is patterned in accordance with the desired pattern of openings, the photoresist is removed above the layer of dielectric in accordance with the pattern for the to be created openings. The dielectric layer is then etched, that is the dielectric is removed in accordance with the pattern of the openings. A dry etch is typically performed, exposing the dielectric layer to a plasma that is created by using one or more gasses that expose the surface of the oxide where the photoresist has been removed. For etchant gasses, halocarbons or their compounds can be used. Etchants can contain dimethylsulfoxide DMSO or monoethanolamine (MEA). Etching gases are typified by $CHF_3$ and $CF_4$ and the energy of incident ions of $CFx^+$ released therefrom. $H_2$ can be added to the etching gas. Etchant gasses can contain a mixture of fluorocarbon compounds and a halogen compound. Etchant gasses can also contain carbonyl, thionyl, sulfucyl, nitrosyl, nitryl and $C_2HF_5$. Etchant gasses can further contain $SiCl_4$ and $SiF_4$ in combination as a plasma etch. The type of etchant that is applied for a particular step of etching openings will be determined by the processing and functional application of the openings within the overall device structure.

The process of etching is typically defined by etching process control parameters such as the etchant or gas used, the flow rate of the etchant (in sccm), additional etchant gasses used with their flow rate, the gas pressure (expressed in Pa. or Torr), the RF power density applied during the process of etching (for instance 1.8 $W/cm^2$ at 13.56 MHz), the magnetic field density if used (for instance $1.5 \times 10^{-2}$ T), and the wafer temperature (for instance 0 degrees C.). It is clear that these parameters are highly application dependent and that the particular parameters that are applied during a given process of etching often represent a "best can do" compromise for that process of etching. Increased circuit density often brings with it the need to create openings that have a high aspect ratio. For high aspect ratio openings, it is critical that openings are created that have a profile that allows for complete penetration of the metal that fills the opening while the profile of the opening is such that good adhesion is established between the deposited metal and the sidewalls of the opening. To avoid distortion of the photoresist patterns that are used to create the openings on the dielectric layer, Anti Reflective Coating (ARC) is frequently applied over the surface of the opening. Photolithographic patterning problems can be caused by the increase in use of highly reflective materials such as polysilicon, aluminum, and metal silicides in the creation of the semiconductor device. These materials can cause unwanted reflections from the underlying layers resulting in distortion of the creation of the openings. Anti-reflective coatings (ARC's) are used to minimize the adverse impact due to reflectance from these reflective materials. In many instances, these ARC's are conductive materials which are deposited as a blanket layer on top of metal and simultaneously patterned with the metal to form interconnects. A problem with these ARC's is that many of the metals cannot be used in applications such as dual damascene, wherein the metal layer is not patterned. In a dual damascene application, openings are formed in the interlayer dielectric, and the metal is blanket deposited in those openings and subsequently polished back to form a planar inlaid plug. In such application, the metal layer is never etched and therefore, any conductive ARC a top of the inlaid metal would cause the metal plugs to be electrically short-circuited together through the conductive ARC.

For the creation of the single damascene structure, vias only are created. For the creation of the dual damascene, vias are created and conductors are created above the vias. For the dual damascene, special etch procedures can be used to form both the vias and the conductor patterns in the dielectric layer before the deposition of metal and the metal CMP. A thin etch stop layer can be used for this purpose between two layers of dielectric $SiO_2$.

The damascene process first etches the conductor pattern into the dielectric after which the etched pattern is filled with metal to create the buried metalization that also has a surface of good planarity. This damascene process also eliminates the need of a dielectric deposition in order to fill the gaps.

A planarized metal deposition process can be used for this to fill the pattern that has been created in a dielectric layer of SiO$_2$. An etchback or CMP process will remove the excess metal over the field regions. CMP thereby offers the advantage of providing a globally planarized surface. The indicated processing steps can be applied to both single and dual damascene.

For the dual damascene process, the processing steps can follow three approaches.

Approach 1, the via is created first. The vias are formed by resist patterning after which an etch through the triple layer dielectric stack is performed. This is followed by patterning the conductor in the top layer of SiO$_2$ thereby using the SiN as an etch stop layer.

Approach 2. The conductor first process. The conductor patterns is formed by resist patterning and by etching the conductor patterns into the first SiO$_2$ layer thereby using the SiN layer as an etch stop layer. This is followed by via resist patterning and etching through the thin layer of SiN and the second SiO$_2$ layer.

Approach 3. Etch stop layer first. The first SiO$_2$ layer is deposited, followed by the thin layer of SiN as etch stop, followed by the via resist patterning and etching of the SIN layer. This is followed by depositing the top SiO$_2$ layer and then the conductor patterning. In etching the conductor pattern in the top SiO$_2$ layer, the etching process will be stopped by the SiN layer except where the via holes are already opened in the SiN layer thereby completing the via holes etching in the first SiO$_2$ layer simultaneously.

FIGS. 1a and 1b further detail the above.

FIG. 1a gives and overview of the sequence of steps required of forming a Prior Art dual Damascene structure. The numbers referred to in the following description of the formation of the dual Damascene structure relate to the cross section of the completed dual Damascene structure that is shown in FIG. 1b.

FIG. 1a, 21 shows the creation of the bottom part of the dual Damascene structure by forming a via pattern 22 on a surface 24, this surface 24 can be a semiconductor wafer but is not limited to such. The via pattern 22 is created in the plane of a dielectric layer 19 and forms the lower part of the dual Damascene structure. SiO$_2$ can be used for this dielectric.

FIG. 1a, 22 shows the deposition within plane 30 (FIG. 1b) of a layer of non-metallic material such as poly-silicon on top of the first dielectric 19 and across the vias 22, filling the via openings 22.

FIG. 1a, 23 shows the formation of the top section 41 of the dual Damascene structure by forming a pattern 41 within the plane of the non-metallic layer 30. This pattern 41 aligns with the pattern of the previously formed vias 22 (FIG. 1a, 21) but it will be noted that the cross section of the pattern openings 41 within the plane 30 of the non-metallic layer is considerably larger than the cross section of the via openings 22 (FIG. 1a, 21). After pattern 41 has been created and, as part of this pattern creation step, the remainder of the non-metallic layer 30 is removed while the pattern 41 remains at this time.

FIG. 1a, 24 shows the deposition and planarization (down to the top surface of pattern 41) of an inter level dielectric (ILD) 50, a poly-silicon can be used for this dielectric.

FIG. 1a, 25 shows the creation of an opening by removing the poly-silicon from the pattern 41 and the vias 22. It is apparent that this opening now has the shape of a T and that the sidewalls of the opening are not straight but show a top section that is larger than the bottom section.

FIG. 1a, 26 shows the cross section of the dual Damascene structure where a barrier 70 has been formed on the sides of the created opening. The opening, which has previously been created by removing the poly-silicon from the pattern 41 and the vias 22, has been filled with a metal. Metal such as Wolfram or copper can be used for this latter processing step.

FIGS. 2, 3 and 4 show a Prior Art sequence of steps that are used to create a dual damascene structure using ARC. Highlighted in these figures is the problem of contour faceting that is addressed by the invention, as follows:

FIG. 2 shows a cross section of the opening 70 that has been created through the two layers of dielectric 66 and 68. Layer 60 is a stop layer that has been deposited prior to the formation of the first layer of dielectric 66. This layer is typically deposited to a thickness of 1000 Angstrom and can contain SiON. Layer 60 is the etch stop layer for etching the opening 70. Over layer 66 of dielectric a second stop layer 62 is deposited, also typically to a thickness of about 1000 Angstrom while this layer also can contain SiON. This stop layer 62 serves as the stop for the etching of the interconnect line pattern that forms the top section of the profile of the dual damascene structure. A second layer 68 of dielectric is deposited over the second stop layer 62. A final layer 64 is deposited over the surface of the second dielectric 68, this layer can contain SiON and serves as a stress relieve layer over the dielectric layer 68. The lower section (roughly below the top surface of the second stop layer 62) of opening 70 forms the plug section of the dual damascene structure, the upper section (roughly above the top surface of the second stop layer 62) needs to be widened (etched) in order to form the interconnect pattern of the dual damascene structure. The stop layers 60, 62 and 64 of SiON can be formed to a thickness of between about 800 and 1,200 Angstrom through a CVD method.

FIG. 3, shows how, before this latter etch takes place, an ARC layer 72 is deposited inside opening 70 and over the top surface of layer 64 of SiON. This layer serves the purpose that has been detailed above for the function of ARC layers. This layer further serves the function of protecting the etch stop layer 60 at the bottom of this opening. The ARC layer also allows, due to its protective nature, for a decrease in the thickness of layer 60 whereby layer 60 continues to serve as a stop layer during the first etch (to create the lower section of the dual damascene structure). The deposition of layer 72 of ARC further allows for a decrease in the thickness of the Inter Metal Dielectric (IMD) layer 68 thereby providing a level of control over the profile of the created opening of the dual damascene structure. Photoresist layer 74, deposited to a thickness of about 8000 Angstrom, forms a positive photoresist material and is deposited over the surface of layer 72 and patterned to created the top profile of the dual damascene structure. The second layer of dielectric 68 can now be etched.

FIG. 4 shows a cross section after the latter etch has been completed and highlights the problem that is addressed by the invention. Critical dimension control of the dual damascene profile requires that all angles of corners and contours of the dual damascene are 90-degree angles. FIG. 4 shows that this is not the case for the section 76 of the structure, the etch to create the upper section of the dual damascene structure has etched away part of the stop layer 62 and underlying parts of the adjacent corner of dielectric 66. This results in an undesirable profile of the dual damascene structure. The invention addresses this over-etch aspect of creating a dual damascene opening and provides a method of avoiding the over-etch. This over-etch, that is the removal of the rectangular triangles in the areas 76, is generically referred to as the faceting problem.

U.S. Pat. No. 5,562,801 (Nulty) shows an oxide etch process.

U.S. Pat. No. 5,753,418 (Tsai et al.) shows an etch process using a BARC.

U.S. Pat. No. 5,677,017 (Armacost et al.) discloses a HDP-CF based oxide etch.

U.S. Pat. No. 5,811,357 (Armacost et al.) teaches a CF based oxide etch process.

SUMMARY OF THE INVENTION

A principle objective of the invention is to improve contouring of the ARC after etching during copper dual damascene formation.

Another objective of the invention is to decrease the thickness of the required ARC layer during copper dual damascene formation thereby reducing processing cost.

Another objective of the invention is to increase the protection of the etch stop layer at the bottom of the opening created during copper dual damascene formation.

Another objective of the invention is to reduce the thickness of the stop layer that is used to stop the etch of the upper part of the dual damascene structure thereby improving the dielectric constant of the Inter Metal Dielectric.

In accordance with the objectives of the invention a new method is provided for creating the interconnect pattern for dual damascene structures. The dual damascene structure is created in two overlying levels of dielectric, a second etch stop layer of SiN is deposited between the two layers of dielectric. A first etch stop layer is first deposited over the surface of the substrate on which the dual damascene structure is to be created, this first etch stop is to stop the etching of the first opening that penetrates through both layers of dielectric. The bottom part of this opening forms the plug part of the dual damascene structure. The second stop layer is deposited between the layers of dielectric, this second stop layer stops the etch for the top or interconnect line part of the dual damascene structure. The second etch penetrates the top dielectric layer. Before the second etch is performed, a layer of ARC is deposited over the surface of the second dielectric and inside the opening created through the first and the second layer of dielectric. The interconnect line etch is then performed. For the etch of the interconnect line a polymer rich etchant is used which protects the sidewalls of the opening. The etch for the interconnect line removes the second layer of dielectric in accordance with the pattern of the interconnect line and, in addition, leaves in place a fence of material (containing C, H, F and oxide compounds) that is formed around the upper perimeter of the opening through the lower layer of dielectric and overlying the second etch stop layer that is in place between the two layers of dielectric. This fence protects the upper corners of the lower opening of the dual damascene structure and is, after the interconnect line pattern has been created in the upper layer of dielectric, removed in a two step procedure. At the completion of this two step procedure, the fence has been removed while the upper corners of the lower opening of the dual damascene structure have retained a rectangular profile. A final step removes the photoresist (that has been used to create the interconnect line opening) from the surface of the second layer of dielectric while the remnants of the ARC material are also removed.

BRIEF DESCRIPTION OF THE DRAWINGS

FIGS. 1a and 1b give and overview of the dual damascene processing sequence.

FIGS. 2 through 4 give a cross section of the Prior Art faceting problem, as follows:

FIG. 2 shows a Prior Art cross section of the narrow opening created through two layer of dielectric to form the dual damascene structure.

FIG. 3 shows a Prior Art cross section of the narrow opening created through two layer of dielectric to form the dual damascene structure after a layer of ARC has been deposited and the photoresist pattern has been created.

FIG. 4 shows a Prior Art cross section after the etch to create the upper part of the dual damascene structure and the problem of faceting of the dual damascene opening.

FIGS. 5 through 9 give cross sections of the dual damascene opening during the processing of the invention, as follows:

FIG. 5 shows a cross section of the opening after first etch (to create the plug part of the dual damascene structure) and the deposition of a layer of ARC.

FIG. 6 shows a cross section of the opening after a layer of photoresist has been deposited and patterned for the interconnect line opening.

FIG. 7 shows a cross section of the opening after the interconnect line opening has been etched whereby a fence of material remains in place around the perimeter of the lower opening of the dual damascene structure.

FIG. 8 shows a cross section of the opening after the fence has been removed from around the perimeter of the lower opening of the dual damascene structure.

FIG. 9 shows a cross section of the opening after the removal of the patterned layer of photoresist and the removal of the remaining ARC from the inside the dual damascene structure.

DESCRIPTION OF THE PREFERRED EMBODIMENTS

Figure 7:
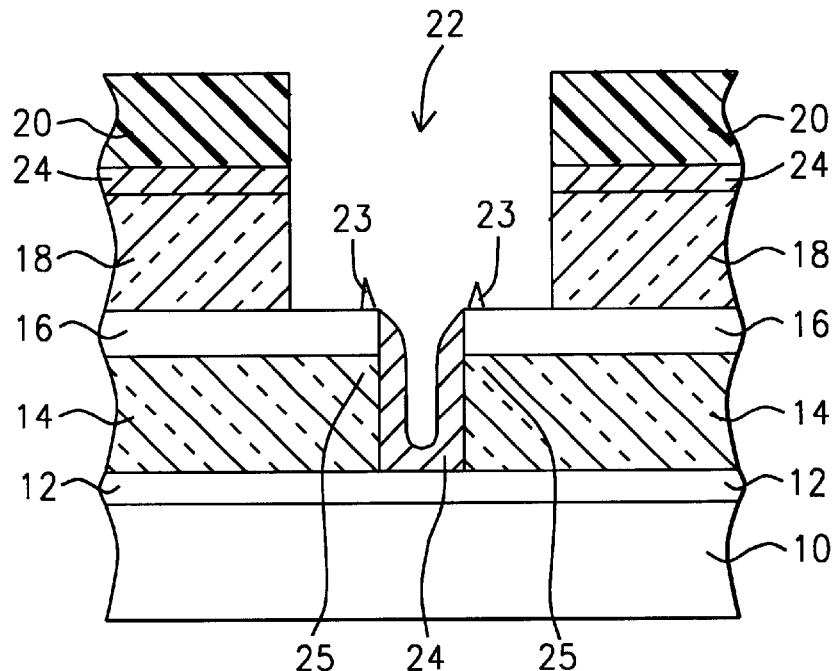

The dual damascene structure is created in two layers of dielectric, the contact plug of the structure is in the bottom layer of dielectric while the interconnect line pattern is created in the upper layer of dielectric. Etch stop layers are used at the bottom of the opening for the contact plug and at the interface between the two layers of dielectric. The (narrower) opening is first etched all the way through both layers of dielectric. This forms a width of the lower part of the etched opening for the dual damascene contact plug. The top of the opening created in this manner must be widened for the interconnect line pattern of the dual damascene structure. Before this widening of the top part of the created opening occurs, a layer of ARC is deposited over the inside surfaces of the opening. This layer of ARC is blanket deposited over the top surface of the second layer of dielectric and along the inside walls and bottom of the opening. The interconnect line pattern is next etched through the upper layer of dielectric, this etch is stopped by the etch stop layer that has been deposited between the two layers of dielectric. Control of critical dimensions of the created dual damascene opening requires that the profiles of the lower (contact plug) and the upper part (the interconnect line part) of the dual damascene opening essentially are a rectangle. Prior Art procedures for the creation of a dual damascene structure do not typically result in these required profiles. The inside corners of the profile, where the cross section of both the upper and the lower sections meet, are etched away during the etch of the upper section of the opening. This results in a sloping profile where a profile of 90 degrees is required.

FIG. 5 shows the cross-section of the dual damascene opening after the first etch has been completed. A layer 24 of ARC has been blanket deposited over the surface of the top dielectric 18 and inside the opening 22. A first stop layer 12 of SiON has been deposited over the surface of the substrate 10, the first layer 14 of dielectric has been deposited over layer 12, a second stop layer 16 of SiON has been deposited over the surface of the fist layer of dielectric 14. The second layer 18 of dielectric has been deposited over the second stop layer 16. Opening 22 has been etched (with anisotropic, RIE processing using $CHF_3$ as etchant) through the first and second layer of dielectric down to the top surface of the first etch stop layer 12.

A blanket layer 24 of ARC has been deposited over the surface of layer 18 and the inside of opening 22 covering the sidewalls and bottom of this opening. Layers 12 and 16 have been deposited to a thickness of about 1000 Angstrom, r.f. sputtering techniques can be used for the deposition of these stop layers.

The ARC layer 24 can be formed through a spin coating method as is conventional in the art followed by a thermal cure at a temperature of about 120 degrees C. for a time period of about 90 seconds to yield a blanket focusing layer when cured of a thickness of about 1500 angstrom.

The first dielectric (14) and second dielectric (18) can contain SiO and can be deposited using LPCVD, PECVD or APCVD processing at a temperature between about 400 to 800 degrees C. to a thickness between about 5000 and 10000 Angstrom. Opening 22 can be formed using anisotropic, RIE processing, using $CHF_3$ as an etchant.

FIG. 6 shows a cross section of the dual damascene opening after a layer 20 of photoresist has been deposited over the surface of the ARC layer 24 and has been patterned for the formation of the upper (interconnect line) opening of the dual damascene structure. This processing steps uses conventional methods of photoresist deposing and patterning.

FIG. 7 shows a cross section after the second layer 18 of dielectric has been etched to form the upper portion of the dual damascene structure. The etching of the dielectric layer 18 uses a $C_4F_8$/CO/Ar etch gas mixture. This etchant gas protects the exposed sidewalls of the opening.

The processing parameters for the etch of the second layer 18 of dielectric are as follows: etchant: $C_4F_8$ at a temperature of between about 50 and 70 degrees C. and a pressure between about 50 and 60 mTorr and a flow rate of between about 12 and 16 sccm. The CO gas is processed at a temperature of between about 50 and 70 degrees C. and a pressure of between about 50 and 60 mTorr and a flow rate of between about 300 and 400 sccm. The mix of $C_4F_8$ to CO has a ratio of between about 1/20 and 1/30.

It must be noted from FIG. 7 that fence 23 remains in place around the upper perimeter of the lower portion of the opening 22 that has been created through the layer 14 of dielectric. This fence contains C, H, F and oxide compounds that have been left in place during the etch of the upper opening though the layer 18 of dielectric. The presence of fence 23 protects the upper perimeter of the lower portion of opening 22, the regions that have been highlighted as regions 25 in FIG. 7, against chemical attack, leaving the upper corners 25 of the lower portion of opening 22 in tact. This is the main objective of the invention, that is to create a dual damascene profile with well defined corners whereby the previously highlighted faceting problem has been eliminated.

Figure 8:
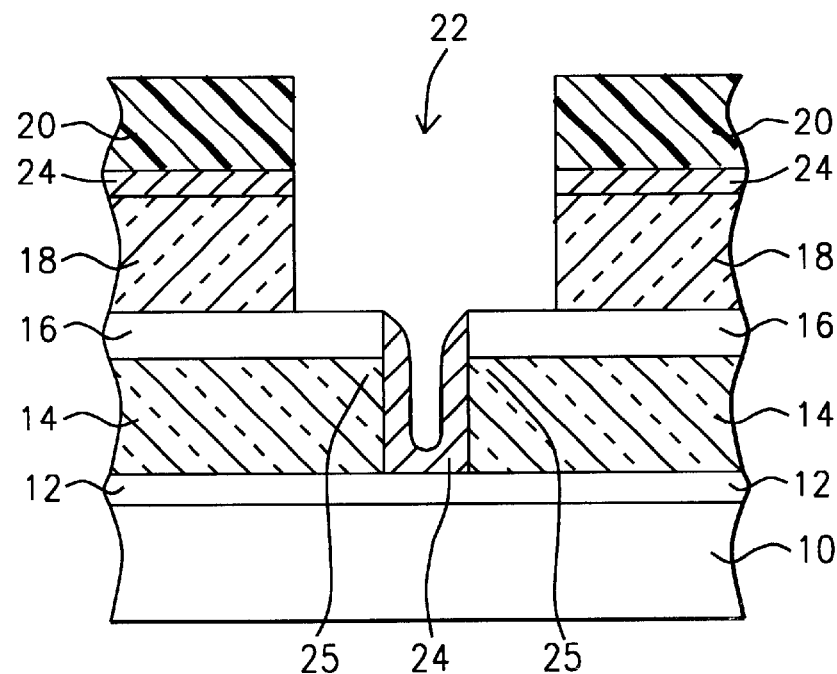

FIG. 8 shows a cross section after the fence 23 has been removed from the opening 22. This removal has been accomplished by means of a $O_2$ plasma treatment that removes the C and H containing portions of the fence. The oxide containing portions of the fence 23 are further removed using a $C_4F_8$/CO/Ar etchant procedure.

This process of removing the polymer components from the inside of the opening can be repeated several times to where the point is reached where all the polymer components are removed from the opening.

The processing conditions for the $O_2$ flush steps are as follows: a temperature of between about 50 and 70 degrees C. with a pressure between about 40 and 60 mTorr with a concentration of between about 1/5 and 1/8. The gas chemistry is Ar/$O_2$ in flush stop, the etch time is between about 10 and 20 seconds. The $O_2$ flush removes the C and H components of the fence from the opening 22.

Figure 9:
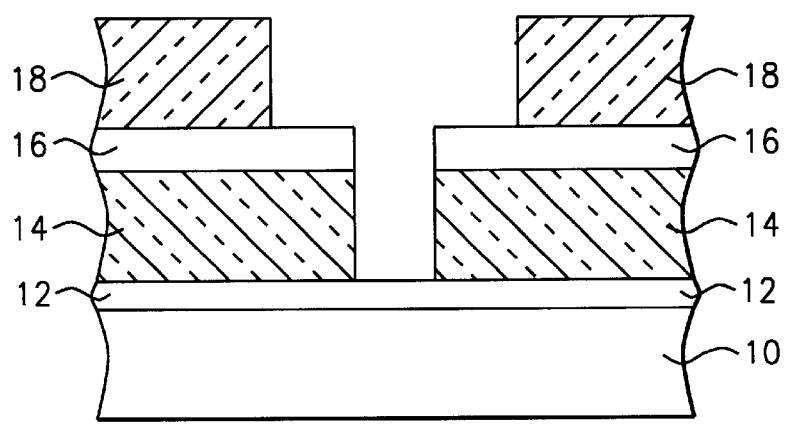

FIG. 9 shows a cross section of the dual damascene structure after the layer 20 of photoresist has been removed from the surface of the layer of ARC while the remnants of the ARC have further been removed from the surface of the second layer 18 of dielectric and from inside the opening 22.

The exposed portions of the ARC on the surface of the dielectric and the sidewalls of the opening can be etched in a plasma etch method employing an etchant gas composition comprising carbon tetrafluoride and argon. The plasma etch method can be applied at a reaction chamber pressure of about 1800 Torr, a r.f. power of about 1200 Watt at a radio frequency of about 13.56 MHz, a substrate temperature of about zero degrees, a carbon tetrafluorice flow rate of about 70 sccm and an argon flow rate of about 650 sccm for a time period of about 50 seconds which included about 20 percent over-etch.

It will be apparent to those skilled in the art, that other embodiments, improvements, details and uses can be made consistent with the letter and spirit of the present invention and within the scope of the present invention, which is limited only by the following claims, construed in accordance with the patent law, including the doctrine of equivalents.

What is claimed is:

1. A method of forming a dual damascene opening, said dual damascene opening containing an upper or interconnect line portion and a lower or plug portion, comprising:

providing a semiconductor substrate;

depositing a first stop layer over the surface of said substrate;

depositing a first layer of dielectric over said first stop layer;

depositing a second stop layer over said first layer of dielectric;

depositing a second layer of dielectric over said second stop layer;

creating an opening having sidewalls and a bottom through said first and second dielectric, thereby including said second stop layer;

depositing a layer of ARC over said second layer of dielectric, thereby including the sidewalls and the bottom of said opening;

etching said interconnect line pattern of said dual damascene structure, thereby partially removing said ARC from inside of said opening, thereby furthermore leaving remnants of chemical materials in place around an upper perimeter of said lower portion of said dual damascene opening, said etching said interconnect line pattern of said dual damascene structure is etching using a polymer rich etchant containing $C_4F_8$/CO/Ar, thereby protecting said sidewalls of said opening;

removing said remnants of chemical materials from around said upper perimeter of said lower portion of said dual damascene opening; and removing said ARC from said sidewalls and said bottom of said opening, thereby simultaneously removing final remnants of said chemical materials in place around said upper perimeter of said lower portion of said dual damascene opening.

2. The method of claim 1 wherein said first and second stop layers contain SiON and are formed to a thickness of between about 800 and 1200 Angstrom through a CVD method.

3. The method of claim 1 wherein said first and second layers of dielectric contain SiO and are deposited using LPCVD, PECVD or APCVD processing at a temperature between about 400 to 800 degrees C. to a thickness between about 5000 and 10000 Angstrom.

4. The method of claim 1 wherein said creating an opening is anisotropic RIE etch using $CHF_3$ as etchant.

5. The method of claim 1 wherein said ARC layer is formed through a spin coating process followed by a thermal cure at a temperature of about 120 degrees C. for a time period of about 90 seconds to yield a blanket focusing layer when cured of a thickness of about 1,500 Angstrom.

6. The method of claim 1 wherein said removing final remnants of said chemical materials in place around said upper perimeter of said lower portion of said dual damascene opening is a $CH_3F/O_2$ SiON etch process.

7. The method of claim 1 wherein removing said remnants of chemical materials from around said upper perimeter of said lower portion of said dual damascene opening is applying an $O_2$ flush cycle thereby removing C and H materials contained within said remnants.

8. The method of claim 1 wherein removing said remnants of chemical materials from around said upper perimeter of said lower portion of said dual damascene opening is applying $C_4F_8/CO/Ar$ etch thereby removing oxide containing materials contained within said remnants.

* * * * *